United States Patent
Bar et al.

(10) Patent No.: US 9,646,914 B2
(45) Date of Patent: May 9, 2017

(54) PROCESS FOR PRODUCING A MICROFLUIDIC CIRCUIT WITHIN A THREE-DIMENSIONAL INTEGRATED STRUCTURE, AND CORRESPONDING STRUCTURE

(71) Applicant: STMicroelectronics SA, Montrouge (FR)

(72) Inventors: Pierre Bar, Grenoble (FR); Perceval Coudrain, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/958,623

(22) Filed: Dec. 3, 2015

(65) Prior Publication Data
US 2016/0343638 A1  Nov. 24, 2016

(30) Foreign Application Priority Data
May 19, 2015  (FR) ..................... 15 54475

(51) Int. Cl.
*H01L 23/52* (2006.01)
*H01L 23/373* (2006.01)
(Continued)

(52) U.S. Cl.
CPC .......... *H01L 23/373* (2013.01); *H01L 21/486* (2013.01); *H01L 21/4846* (2013.01); *H01L 21/4882* (2013.01); *H01L 23/473* (2013.01); *H01L 23/481* (2013.01); *H01L 23/498* (2013.01); *H01L 23/49827* (2013.01); *H01L 25/0657* (2013.01); *H01L 25/50* (2013.01); *H01L 2225/06513* (2013.01); *H01L 2225/06541* (2013.01); *H01L 2225/06568* (2013.01); *H01L 2225/06589* (2013.01)

(58) Field of Classification Search
CPC ............... H01L 21/4846; H01L 21/486; H01L 21/4882; H01L 23/373; H01L 23/473; H01L 23/498; H01L 23/49827
USPC ........................................................ 257/774
See application file for complete search history.

(56) References Cited

U.S. PATENT DOCUMENTS

| | | | |
|---|---|---|---|
| 6,337,513 B1 | 1/2002 | Clevenger et al. | |
| 7,592,697 B2 * | 9/2009 | Arana .................. | H01L 23/473 257/712 |

(Continued)

OTHER PUBLICATIONS

INPI Search Report and Written Opinion for FR 1554475 dated Apr. 8, 2016 (8 pages).

*Primary Examiner* — Luan C Thai
(74) *Attorney, Agent, or Firm* — Gardere Wynne Sewell LLP

(57) ABSTRACT

A three-dimensional integrated structure includes a first and a second element each having an interconnection part formed by metallization levels encased in an insulating region. The first and second elements are attached to one another by the respective interconnection parts. The first element includes an electrical connection via passing through a substrate. A thermal cooling system includes at least one cavity having a first part located in the insulating region of the interconnection part of the first element and a second part located in the insulating region of the interconnection part of the second element and at least one through channel extending from a rear face of the first element to open into the at least one cavity.

7 Claims, 5 Drawing Sheets

(51) Int. Cl.
*H01L 21/48* (2006.01)
*H01L 23/498* (2006.01)
*H01L 23/473* (2006.01)
*H01L 23/48* (2006.01)
*H01L 25/065* (2006.01)
*H01L 25/00* (2006.01)

(56) References Cited

U.S. PATENT DOCUMENTS

| | | | | |
|---|---|---|---|---|
| 8,035,223 | B2* | 10/2011 | Garrou | H01L 23/473 |
| | | | | 257/713 |
| 8,198,174 | B2* | 6/2012 | Hsu | H01L 21/76898 |
| | | | | 257/E21.585 |
| 9,373,561 | B1* | 6/2016 | Clevenger | H01L 23/367 |
| 2003/0157796 | A1 | 8/2003 | Kim et al. | |
| 2007/0126103 | A1* | 6/2007 | Shi | H01L 21/6835 |
| | | | | 257/686 |
| 2011/0031633 | A1 | 2/2011 | Hsu et al. | |

* cited by examiner

PROCESS FOR PRODUCING A MICROFLUIDIC CIRCUIT WITHIN A THREE-DIMENSIONAL INTEGRATED STRUCTURE, AND CORRESPONDING STRUCTURE

PRIORITY CLAIM

This application claims priority from French Application for Patent No. 1554475 filed May 19, 2015, the disclosure of which is incorporated by reference.

TECHNICAL FIELD

The invention relates to integrated circuits, in particular to integrated three-dimensional structures or stacks, and more particularly to heat dissipation inside such structures.

BACKGROUND

In operation, the various components of the various integrated circuits or dies of the three-dimensional structure release heat; however, this released heat limits the power of the integrated circuits and consequently the performance thereof, which is particularly critical in certain applications, such as for example telephony applications.

Furthermore, the intensity of the heat and the thermal flows are not uniform inside the structure, and many thermal obstacles such as, for example, materials with low thermal conductivity and/or the integrated circuits themselves limit the heat dissipation of the structure.

Currently, cooling systems produced in integrated three-dimensional structures are already known but they comprise for example channels snaking into the silicon optionally using through silicon via (TSV) structures, and the production thereof is complex and requires a dedicated manufacturing process.

SUMMARY

According to one embodiment, a process is proposed here for producing a three-dimensional integrated structure that offers in particular a simpler production of a heat dissipation circuit, compatible with existing CMOS processes.

According to one aspect, a process is proposed for producing a thermal cooling system within a three-dimensional integrated structure, said structure comprising a first and a second element each having an interconnection part comprising metallization levels encased in an insulating region, the two elements being firmly attached to one another by means of their respective interconnection part, the first element additionally comprising at least one via partly passing through the substrate of this first element and cooperating electrically with an external connection means located on the rear face thereof.

The two elements may be, for example, two dies, or else at least one of the two elements may be an active or passive platform known by persons skilled in the art as an "interposer".

According to a general feature of this aspect, said cooling system comprises:

a production, in the insulating region of each interconnection part (commonly denoted by persons skilled in the art by the acronym BEOL: Back End Of Line), of a metal block, the two metal blocks being mutually in contact during the firm attachment to one another of the two elements;

a production in the first element, at the same time as the production of said at least one through via, of at least one additional through via contacting the corresponding metal block; and a removal of the metal contained in said at least one additional via and in the two blocks, subsequently to the assembling of the two elements, by etching from said rear face so as to form said thermal cooling system comprising a cavity in place of the blocks and at least one through passage in place of said at least one additional through via.

In other words, according to this aspect, the through passages intended to convey the cooling fluid are produced at the same time as the TSV vias and are at this stage filled with metal. These cooling passages are therefore vertically aligned with the TSV vias.

Next, these passages are emptied of the metal at the same time as the formation of the cavities via one and the same etching operation carried out from the rear face at the end of the assembly of the three-dimensional structure.

The two metal blocks, which will be emptied subsequently in order to form the cavity, form sacrificial bonding pads and their geometry may be designed and optimized in the same way as that of the metal lines of an interconnection (BEOL) part, since they are produced in this BEOL part. Thus, the blocks are not necessarily of parallelepipedal shape but may have any shape.

A cooling system is thus obtained that has a reduced production cost since it is obtained by conventional steps of a CMOS process and not by a dedicated process.

Furthermore, the cooling system may be positioned as close as possible to the active components.

According to another aspect, a three-dimensional integrated structure is proposed comprising a first and a second element each having an interconnection part comprising metallization levels encased in an insulating region, the two elements being firmly attached to one another by means of their respective interconnection part, the first element additionally comprising at least one via partly passing through the substrate of this first element and cooperating electrically with an external connection means located on the rear face thereof.

According to a general feature of this other aspect, said three-dimensional integrated structure also comprises a thermal cooling system comprising at least one cavity having a first part located in the insulating region of the interconnection part of the first element and a second part located in the insulating region of the interconnection part of the second element and at least one through passage extending from the rear face of the first element in order to open into said at least one cavity.

BRIEF DESCRIPTION OF THE DRAWINGS

Other advantages and features of the invention will appear on examining the detailed description of the by no means limiting method of implementation and embodiment, and the appended drawings in which.

DETAILED DESCRIPTION

Figure 1:
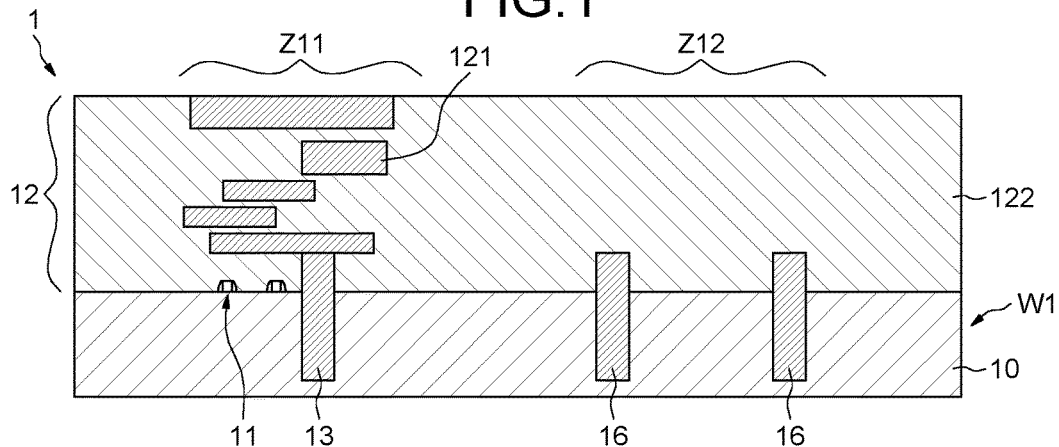
FIGS. 1 to 10 schematically illustrate methods of implementation and embodiments.

In FIG. 1, a semiconductor wafer W1 is used to start with in which a first die 1, or lower die, having a three-dimensional structure will be produced.

The future lower die comprises two zones Z11 and Z12. Zone Z11 is intended to comprise, in particular, components 11 surmounted by an interconnection (BEOL) part 12. Zone Z12 is intended to receive a cooling system.

Made firstly in the first zone Z11, is the part known by persons skilled in the art as the "front end of line" (FEOL), incorporating the various circuit components 11 of the die, for example transistors.

Next, in this example, prior to the production of the interconnection part 12, a via 13 is produced that partly passes through the substrate 10 known by persons skilled in the art as a TSV (through-silicon via) according to a process known by persons skilled in the art. Here this is a via known as a "TSV middle" via, since it is produced after the components and before the formation of the BEOL part.

At the same time as the production of the TSV middle via(s) additional through vias 16 are produced by the same process steps in the zone Z12 of the substrate. The additional vias vertically aligned with the TSV(s) 13, will form, as will be seen in greater detail below, fluid circulation passages for a cooling fluid (cooling fluid inlet/outlet).

Produced next, according to a conventional process that is known per se, is the interconnection (BEOL) part 12 which comprises an assembly of metallization levels 121 in the first zone Z11, encased in an insulating region 122 which covers the first zone Z11 and the second zone Z12 on top of the substrate.

The part of the insulating region 122 located in the second zone Z12 differs from that located in the first zone Z11 in that it does not comprise, at this stage of the process, any metallization levels.

Figure 2:
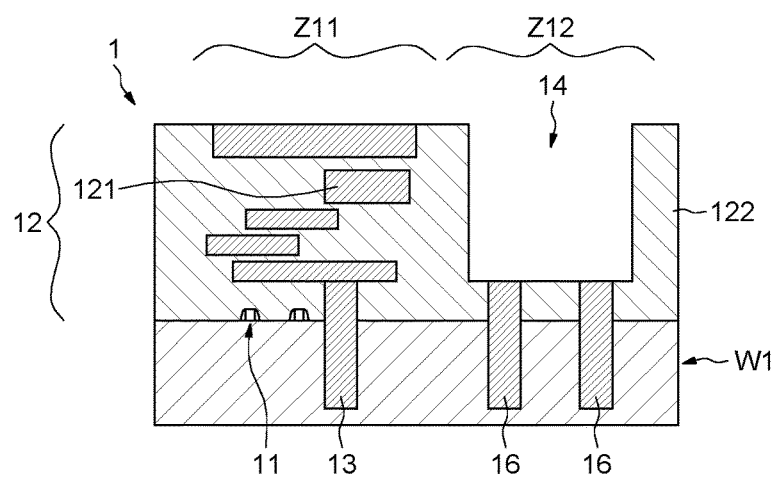

The procedure as illustrated in FIG. 2 is then followed, for the production of a cavity portion 14 by a conventional process that is known per se of localized etching in the insulating material of the insulating region 122 located in the second zone Z12. The depth of said cavity portion may, for example, be of the order of 4 micrometers.

The additional through vias 16 produced previously open into the cavity 14.

Figure 3:
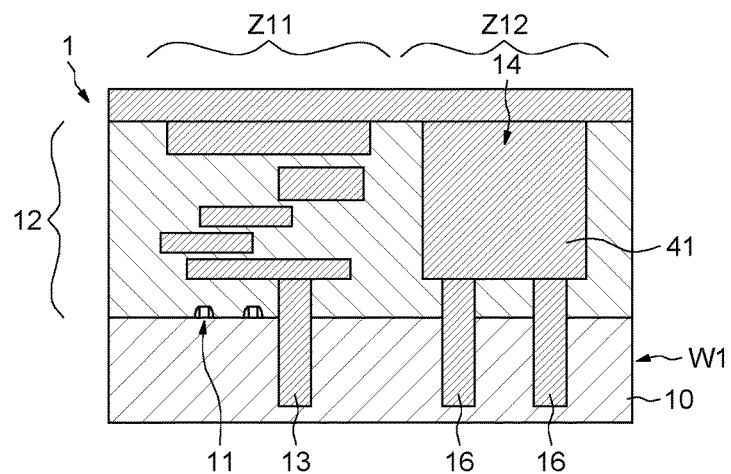

A wafer-scale deposition of a metal material 41, for example of copper, is then carried out in order to fill in said cavity portion 14. The metal material 41 used here is identical to that constituting the additional vias 16 (FIG. 3).

That being so, when copper is used, no barrier layer is formed in the cavity portion 14 prior to the deposition of copper.

Figure 4:
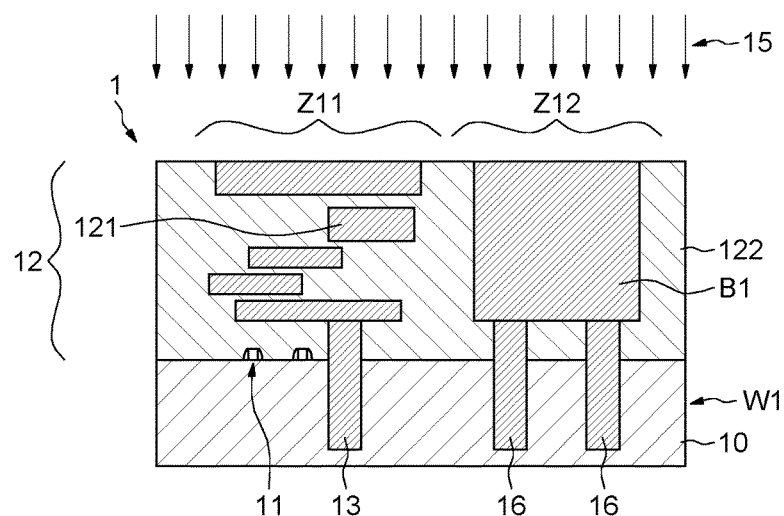

A conventional mechanical-chemical polishing 15 of the interconnection part 12 is then carried out in order to prepare the surface of the first die 1 for subsequent bonding to a second die 2. In particular, the polishing 15 removes the excess copper on the upper surface of the die, leaving, from the previous deposition of copper, only a block B1 in the cavity 14 (FIG. 4). This block B1 forms here a bonding pad.

Figure 5:
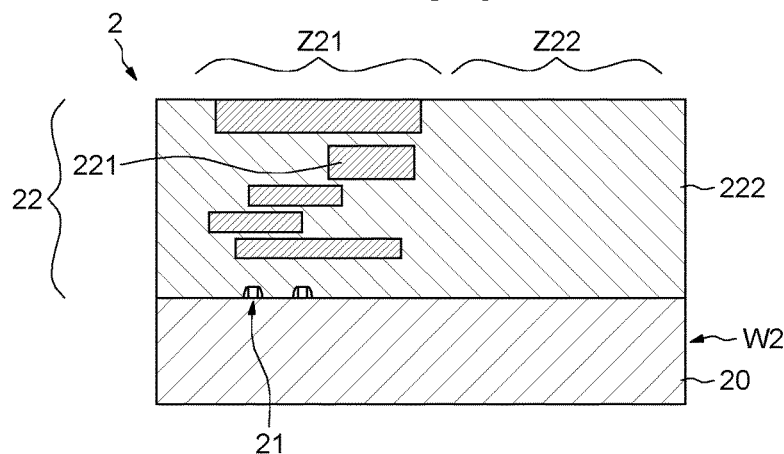

As illustrated in FIG. 5, the second die 2 is prepared from another semiconductor wafer W2, produced on which is the FEOL part, comprising the various circuit components 21 located in the zone Z21, for example transistors, and the interconnection BEOL part located on top of the substrate 20 and which comprises an assembly of metallization levels 221 in the first zone Z21 encased in an insulating material 222 identical to the insulating material 122.

As during the production of the first die 1, the part of the insulating region of the BEOL part located in the second zone Z12 differs from that located in the first zone Z11 in that it does not comprise, at this stage of the process, any metallization levels.

Figure 6:
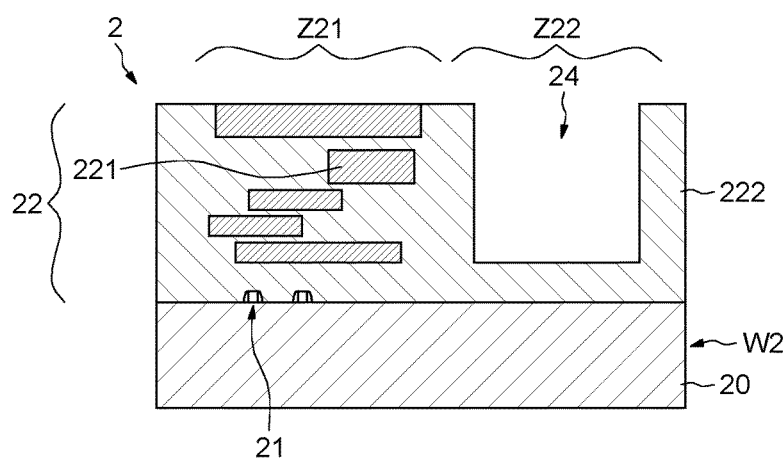

A second cavity portion 24 is also produced by a conventional process that is known per se of localized etching in the zone Z22 of the insulating material 222 of the interconnection part 22 (FIG. 6).

Figure 7:
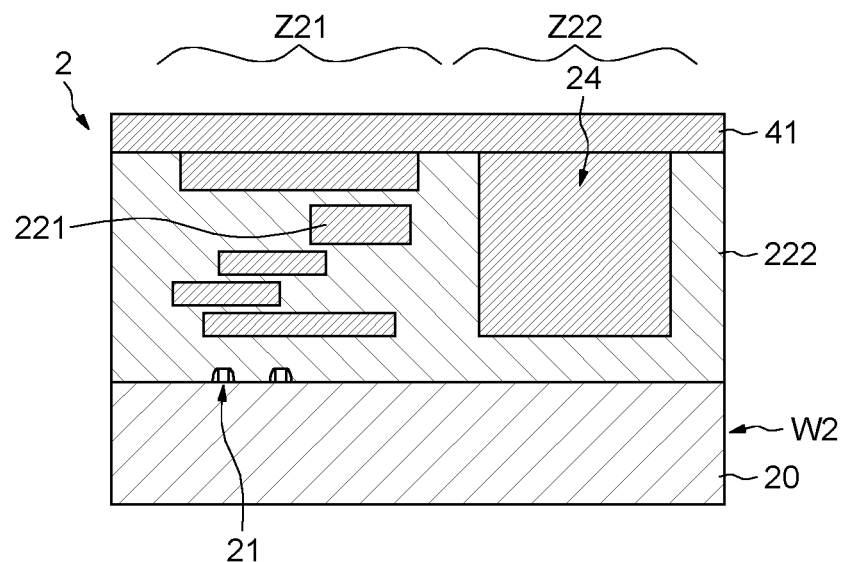

A wafer-scale deposition of copper 41 is then carried out in order to fill in said cavity portion 24 as illustrated in FIG. 7. Here also a prior formation of a barrier layer is avoided.

Figure 8:
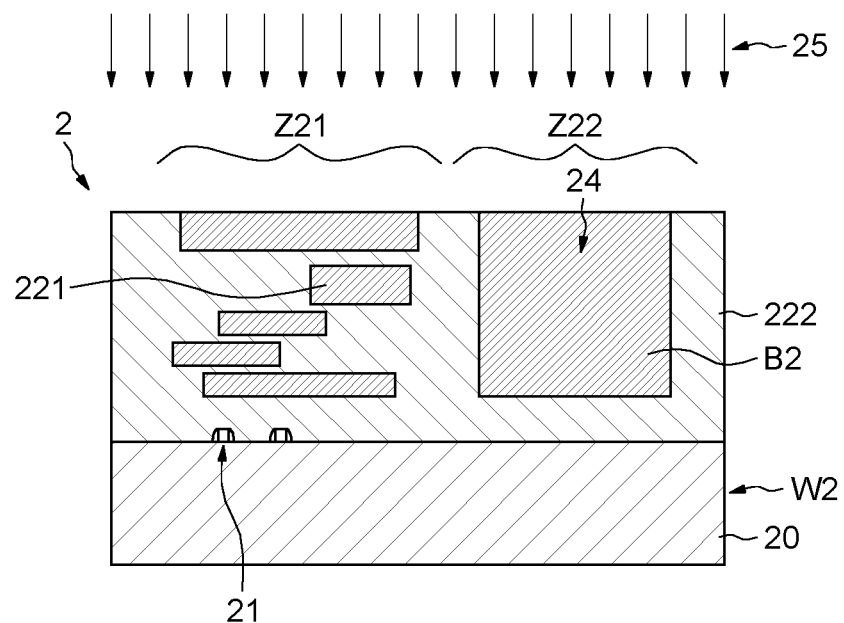

Lastly, the preparation of the second die 2 is finished by a conventional mechanical-chemical polishing 25 of the interconnection part 22 in order to prepare the surface of the second die 2 for subsequent bonding to the first die 1. In particular, the polishing 25 removes the excess copper on the upper surface of the die, leaving, from the previous deposition of copper, only a block B2 in the cavity 24, which forms a sacrificial bonding pad (FIG. 8).

Figure 9:
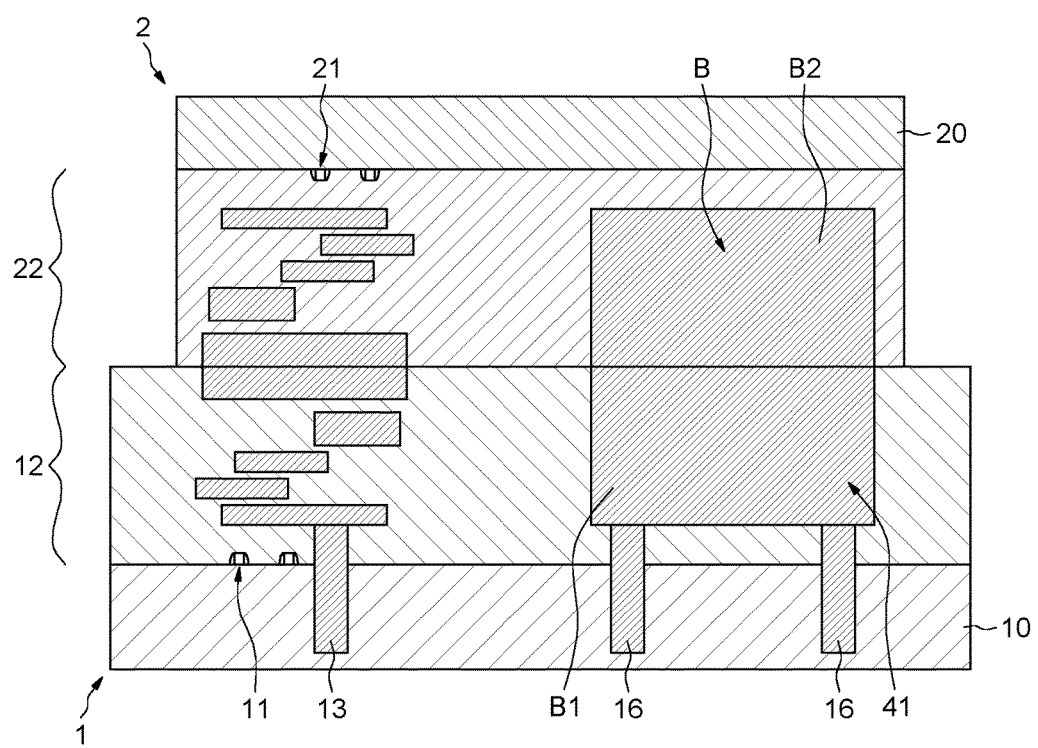

After having individualized the upper die, a face-to-face bonding by means of the interconnection parts 12 and 22 of the two dies is carried out as illustrated in FIG. 9. This bonding is a conventional metal-metal and insulator-insulator (typically $SiO_2$—$SiO_2$) hybrid molecular bonding that is known per se.

Via this bonding, the copper blocks B1 and B2 find themselves opposite one another so as to form only a single block B.

The passivation of the rear face of the wafer W1 is then carried out according to a conventional process, for example the deposition of a polymer layer 5, and contact is re-established with the through via 13 in order to connect it to an external connection means 3, for example a copper pillar known by persons skilled in the art as a "bump".

Likewise, contact is re-established with the through vias 16 in order to make them open onto the rear of the wafer in order to carry out a subsequent etching of the copper 41 filling the through vias 16 and the block B.

Figure 10:
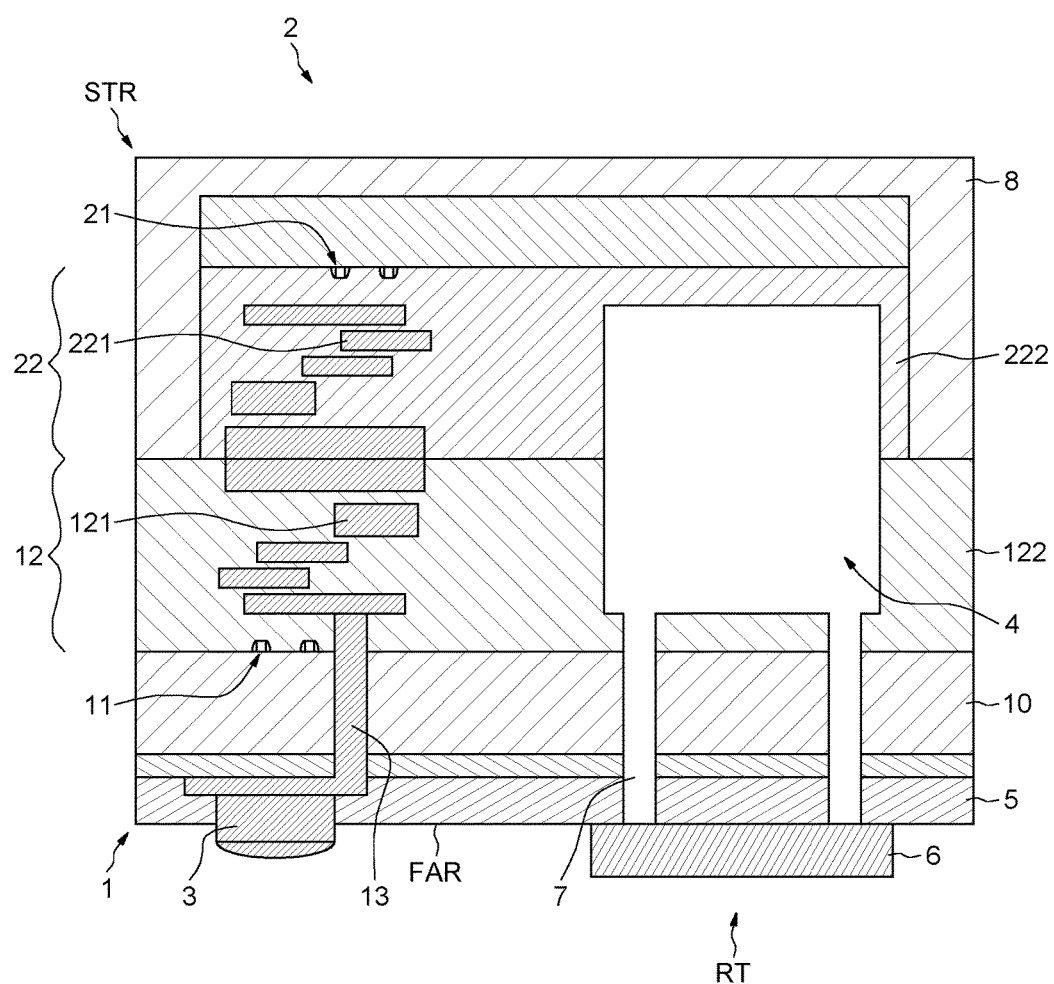

The removal of the copper 41 contained in the cavity 4 and in the through vias 16 is then carried out (FIG. 10), according to a conventional process of wet etching through the through vias 16. Use may, for example, be made of DSP (dilute sulphuric acid/hydrogen peroxide) or DPP (dilute phosphoric acid/hydrogen peroxide) etching.

Via this step, the cavity 4 forming a microfluidic network, and also its inlets/outlets 7 (through passages) are formed.

The through passages 7 are connected to a thermal coolant supply microsystem 6, and the die 2 is encapsulated in an encapsulating resin 8.

After cutting the wafer W1, a three-dimensional integrated structure STR, comprising two dies 1 and 2 that are firmly attached to one another by means of their interconnection part 12 and 22, is finally obtained. Each of the interconnection parts comprises several metallization levels encased in the insulating regions 122 and 222.

The first die 1 comprises at least one via 13 partly passing through the substrate 10 and cooperating electrically with an external connection means 3 located on the rear face FAR thereof.

Said structure STR comprises a thermal cooling RT system comprising a cavity 4 located in the interconnection parts 12 and 22 of the dies 1 and 2, and two through passages 7 extending from the rear face of the first die in order to open into the cavity 4.

It should be noted that the embodiments presented here are in no way limiting. In particular, although it is a question in this example of "TSV middle" vias, the process proposed here is also compatible with "TSV last" vias, that is to say those produced after the formation of the interconnection part 12.

Furthermore, although a "die-to-wafer" type process is described here, the invention is also compatible with what is known by persons skilled in the art as a "wafer-to-wafer" type integration, which is limited to dies of identical size but is simpler from the point of view of the bonding (the encapsulating resin 8 will then be put in place after cutting the stack of the two wafers 1 and 2). The process may also be extended to several dies stacked on the element 1.

Moreover, the element 1 is not necessarily a die or a wafer but may for example be an active or passive platform, known by persons skilled in the art as an "interposer".

The invention claimed is:

1. A process for producing a three-dimensional integrated structure comprising:
   separately forming a first element and a second element, each first and second element having an interconnection part comprising metallization levels encased in an insulating region,
   producing in the first element at least one via passing through a semiconductor substrate of the first element;
   producing in the insulating region of each interconnection part a metal block, wherein the metal block of the first element has a first outer surface and the metal block of the second element has a second outer surface;
   producing in the first element at least one additional via passing through the semiconductor substrate of the first element and contacting the metal block in the insulating region of the first element;
   firmly attaching the first and second elements to one another by attaching their respective interconnection parts and attaching the first outer surface to the second outer surface such that the metal blocks of the first and the second elements are physically in contact with each other, and
   then removing metal contained in said at least one additional via and of the metal blocks by etching from a rear face of the semiconductor substrate of the first element so as to form a thermal cooling system comprising a cavity in place of the metal blocks and at least one through passage in place of said at least one additional through via.

2. The process of claim 1, further comprising electrically connecting the at least one via to an external electrical connection located on the rear face of the substrate of the first element.

3. The process claim 1, further comprising coupling a thermal coolant supply microsystem to said at least one through passage.

4. A three-dimensional integrated structure, comprising:
   a first element including a first semiconductor substrate and a first interconnection part over the first semiconductor substrate and comprising metallization levels encased in a first insulating region, said first interconnection part including a first zone including metal lines and a second zone not including metal lines,
   a second element including a second semiconductor substrate and a second interconnection part over the second semiconductor substrate and comprising metallization levels encased in a second insulating region, said second interconnection part including a third zone including metal lines and a fourth zone not including metal lines,
   wherein the first insulating region has a first surface and the second insulating region has a second surface,
   wherein the first and second elements are firmly attached to one another by their respective first and second surfaces of the first and second insulating regions,
   at least one via within the first element passing through the first semiconductor substrate of the first element,
   a thermal cooling system comprising at least one cavity having a first cavity part located in the second zone of the first interconnection part of the first element and a second cavity part located in the fourth zone of the second interconnection part of the second element and at least one through passage extending from a rear face of the first semiconductor substrate of the first element in order to open into said at least one cavity.

5. The structure of claim 4, further comprising an external connection located on the rear face of the substrate and cooperating electrically with said at least one via.

6. The structure of claim 4, further comprising a thermal coolant supply microsystem coupled to said at least one through passage.

7. A method, comprising:
   forming a first element including a first substrate and a first interconnection part, said first interconnection part including a first zone including metal lines and a second zone not including metal lines, the first element having a first attachment surface;
   forming a metal filled via extending through the first substrate and at least partially extending through the first interconnection part;
   opening a first aperture in the first interconnection part at said second zone, said first aperture reaching the metal filled via;
   filling the first aperture with metal to define a first metal block;
   forming, separately from the first element, a second element including a second substrate and a second interconnection part, said second interconnection part including a third zone including metal lines and a fourth zone not including metal lines, the second element having a second attachment surface;
   opening a second aperture in the second interconnection part at said fourth zone;
   filing the second aperture with metal to define a second metal block;
   attaching the first element to the second element by attaching the first attachment surface to the second attachment surface with the first and second metal blocks facing and in contact with each other; and
   etching to remove the metal of the first and second metal blocks as well as the metal of the metal filled via to form an open cavity defined by the first and second aperture and a through passage in place of the metal filled via.

* * * * *